United States Patent
Li et al.

(10) Patent No.: US 12,197,824 B2
(45) Date of Patent: Jan. 14, 2025

(54) METHOD AND SYSTEM FOR STRATEGICALLY SOLVING INNOVATIVE DESIGN PROBLEM

(71) Applicant: Sichuan University, Chengdu (CN)

(72) Inventors: Wenqiang Li, Chengdu (CN); Xing Zhou, Chengdu (CN); Xianglong Li, Chengdu (CN); Diwang Teng, Chengdu (CN); Jiawei Wang, Chengdu (CN); Yingxin Zhao, Chengdu (CN)

(73) Assignee: Sichuan University, Chengdu (CN)

( * ) Notice: Subject to any disclaimer, the term of this patent is extended or adjusted under 35 U.S.C. 154(b) by 0 days.

(21) Appl. No.: 18/772,472

(22) Filed: Jul. 15, 2024

(65) Prior Publication Data

US 2024/0370598 A1   Nov. 7, 2024

(30) Foreign Application Priority Data

Aug. 8, 2023   (CN) .......................... 202311004616.1

(51) Int. Cl.
*G06F 30/17*   (2020.01)

(52) U.S. Cl.
CPC .................................. *G06F 30/17* (2020.01)

(58) Field of Classification Search
CPC ..................................................... G06F 30/17
See application file for complete search history.

(56) References Cited

U.S. PATENT DOCUMENTS

| | | | |
|---|---|---|---|
| 2022/0035849 A1 | 2/2022 | Kawakami et al. | |
| 2023/0117225 A1 | 4/2023 | Porto Guedes et al. | |

FOREIGN PATENT DOCUMENTS

| | | | |
|---|---|---|---|
| CN | 106997383 A | 8/2017 | |
| CN | 109344227 A | 2/2019 | |
| CN | 112786124 A | 5/2021 | |
| CN | 114661890 A | 6/2022 | |
| CN | 115082165 A | * 7/2022 | ............ G06Q 30/06 |
| CN | 115730925 A | 3/2023 | |

(Continued)

OTHER PUBLICATIONS

Zhang J, Cao G, Peng Q, Tan R, Liu W, Zhang H. A systematic knowledge-based method for design of transformable product. Advanced Engineering Informatics. Apr. 1, 2022;52:101638. (Year: 2022).*

(Continued)

*Primary Examiner* — Chuen-Meei Gan

(57) ABSTRACT

A method and system for strategically solving an innovative design problem are provided. A target analysis tool is determined according to a to-be-solved problem. An initial model is generated based on the target analysis tool. A target model is determined according to an interaction relationship among elements in the initial model and the target analysis tool. A problem characterization result of the target model is generated according to a preset interaction relationship. Retrieval information is generated according to the problem characterization result, based on which the retrieval is performed in a preset database to obtain target data. Different analysis tools can be used to analyze different to-be-solved problems. The retrieval is performed based on the problem characterization result to obtain the solution to the to-be-solved problem.

7 Claims, 11 Drawing Sheets

(56) References Cited

FOREIGN PATENT DOCUMENTS

WO     WO 2021/031383 A1 * 11/2019 ............. G06Q 50/18

OTHER PUBLICATIONS

Silva, R.F., Roy, C.K., Rahman, M.M., Schneider, K.A., Paixao, K. and de Almeida Maia, M., 2019, May. Recommending comprehensive solutions for programming tasks by mining crowd knowledge. In 2019 IEEE/ACM 27th International Conference on Program Comprehension (ICPC) (pp. 358-368). IEEE. (Year: 2019).*

Caili Zhang et al., "An Approach of Non-Standard Conflict Problem Solving Based on TRIZ", Machinery Design & Manufacture, No. 11, Nov. 8, 2013, pp. 259-261.

Rodrigo F.G. Silva et al., "Recommending Comprehensive Solutions for Programming Tasks by Mining Crowd Knowledge". 2019 IEEE/ACM 27th International Conference on Program Comprehension (ICPC), May 26, 2019, pp. 358-368.

* cited by examiner

METHOD AND SYSTEM FOR STRATEGICALLY SOLVING INNOVATIVE DESIGN PROBLEM

CROSS-REFERENCE TO RELATED APPLICATIONS

This application claims the benefit of priority from Chinese Patent Application No. 202311004616.1, filed on Aug. 8, 2023. The content of the aforementioned application, including any intervening amendments made thereto, is incorporated herein by reference in its entirety.

TECHNICAL FIELD

This application relates to system analysis in the electromechanical industry, and more particularly to a method and system for strategically solving an innovative design problem.

BACKGROUND

Innovative design issues will be encountered by designers during the design and improvement process of electromechanical products, which need to be analyzed and solved accordingly.

In the prior art, the designers are required to be highly experienced and professional to analyze and solve these problems. In addition, most engineers rely on their work experience to deal with problems, and thus high requirements are put forward for the personal professional knowledge.

Therefore, solid professional knowledge is required for designers to solve problems, which will lead to high solving difficulty and low efficiency.

SUMMARY

An object of the present disclosure is to provide a method and system for strategically solving an innovative design problem, which can improve the problem-solving efficiency.

In order to achieve the above object, the following technical solutions are adopted.

In a first aspect, this application provides a method for strategically solving an innovative design problem, comprising:
step (1) acquiring a to-be-solved problem input by a user;
step (2) determining a target analysis tool according to the to-be-solved problem;
step (3) generating an initial model corresponding to the to-be-solved problem based on the target analysis tool; wherein the initial model is configured to characterize a plurality of first elements related to the to-be-solved problem and an interaction relationship between the plurality of first elements and a second element input by the user;
step (4) determining a target model corresponding to the initial model according to the interaction relationship and the target analysis tool;
step (5) generating a problem characterization result of the target model according to a preset interaction relationship; and
step (6) generating retrieval information according to the problem characterization result, performing retrieval in a preset database according to the retrieval information to obtain target data, and recommending the target data to the user as a solution to the to-be-solved problem.

In some embodiments, the step (2) is performed through steps of:
step (2.1) subjecting the to-be-solved problem to word segmentation to obtain a keyword of the to-be-solved problem; and
step (2.2) determining the target analysis tool according to a word type of the keyword.

In some embodiments, the step (2.2) is performed through a step of:
if the keyword belongs to a preset word type, determining the target analysis tool according to the keyword.

In some embodiments, the step of determining the target analysis tool according to the keyword comprises:
if the keyword belongs to a combination of a verb and a noun, and comprises a causal relationship word, determining the target analysis tool according to the number of the verb;
if the keyword belongs to the combination of the verb and the noun, comprises a competitiveness word, and is free of the causal relationship word, determining the target analysis tool based on whether the keyword comprises a future word and whether the keyword comprises a coordination word;
if the keyword belongs to the combination of the verb and the noun, and does not comprise the causal relationship word and the competitiveness word, determining the target analysis tool based on whether the keyword comprises a factor word;
if the keyword belongs to the combination of the verb and the noun, and does not comprise the causal relationship word, the competitiveness word and the factor word, determining the target analysis tool based on whether the keyword comprises a technical feature word or a structural word; and
if the keyword is an adjective, determining the target analysis tool according to a type of the adjective.

In some embodiments, the step (3) is performed through steps of:
(3.1) generating the plurality of first elements in the target analysis tool according to the to-be-solved problem; wherein the plurality of first elements are configured to characterize a factor affecting the to-be-solved problem; and
(3.2) generating the initial model according to the interaction relationship between the plurality of first elements and the second element.

In some embodiments, the step (4) is performed through steps of:
(4.1) determining a to-be-clipped element among the plurality of first elements according to the interaction relationship, and clipping the initial model in the target analysis tool; and
(4.2) deleting the to-be-clipped element and an interaction relationship involving the to-be-clipped element from the initial model to obtain the target model.

In some embodiments, the step (5) is performed through steps of:
(5.1) extracting at least one element and at least one interaction relationship from the target model according to the preset interaction relationship, and generating a first problem characterization result according to at least one extracted element and at least one extracted interaction relationship; and
(5.2) generating a second problem characterization result based on the first problem characterization result and a response input by the user in accordance with a preset question list.

In a second aspect, this application provides a system for strategically solving an innovative design problem, comprising:

an acquisition module;
a first determination module;
a first generation module;
a second determination module;
a second generation module; and
a retrieval module;
wherein the acquisition module is configured to acquire a to-be-solved problem input by a user;
the first determination module is configured to determine a target analysis tool according to the to-be-solved problem;
the first generation module is configured to generate an initial model corresponding to the to-be-solved problem based on the target analysis tool; and the initial model is configured to characterize a plurality of first elements related to the to-be-solved problem and an interaction relationship between the plurality of first elements and a second element input by the user;
the second determination module is configured to determine a target model corresponding to the initial model according to the interaction relationship and the target analysis tool;
the second generation module is configured to generate a problem characterization result of the target model according to a preset interaction relationship; and
the retrieval module is configured to generate retrieval information according to the problem characterization result, perform retrieval in a preset database according to the retrieval information to obtain target data, and recommend the target data to the user as a solution to the to-be-solved problem.

In some embodiments, the first determination module is specifically configured to perform word segmentation on the to-be-solved problem to obtain a keyword of the to-be-solved problem, and determine the target analysis tool according to a word type of the keyword.

In some embodiments, the first determination module is specifically configured to determine the target analysis tool according to the keyword if the keyword belongs to a preset word type.

In some embodiments, the first determination module is specifically configured to determine the target analysis tool according to the number of a verb if the keyword belongs to a combination of the verb and a noun, and comprises a causal relationship word; determine the target analysis tool based on whether the keyword comprises a future word or a coordination word if the keyword belongs to the combination of the verb and the noun, comprises a competitiveness word, and is free of the causal relationship word; determine the target analysis tool based on whether the keyword comprises a factor word if the keyword belongs to the combination of the verb and the noun, and does not comprise the causal relationship word and the competitiveness word; determine the target analysis tool based on whether the keyword comprises a technical feature word and whether the keyword comprises a structural word if the keyword belongs to the combination of the verb and the noun, and does not comprise the causal relationship word, the competitiveness word and the factor word; and determine the target analysis tool according to a type of the adjective if the keyword is an adjective.

In some embodiments, the first generation module is specifically configured to generate the plurality of first elements in the target analysis tool according to the to-be-solved problem, and generate the initial model according to the interaction relationship between the plurality of first elements and the second element; and the plurality of first elements are configured to characterize a factor affecting the to-be-solved problem.

In some embodiments, the second determination module is specifically configured to determine a to-be-clipped element among the plurality of first elements according to the interaction relationship, clip the initial model in the target analysis tool, and delete the to-be-clipped element and an interaction relationship involving the to-be-clipped element from the initial model to obtain the target model.

In some embodiments, the second generation module is specifically configured to extract at least one element and at least interaction relationship from the target model according to the preset interaction relationship, generate a first problem characterization result according to at least one extracted element and at least one extracted interaction relationship, and generate a second problem characterization result based on the first problem characterization result by interacting with a computer.

In a third aspect, this application provides an electronic device, comprising:

a memory; and
a processor;
wherein the memory is configured to store a program instruction executable by the processor; and the processor is configured to be communicated with the memory through a bus and execute the program instruction to implement the above method.

In a fourth aspect, this application provides a non-transitory computer-readable storage medium, wherein a computer program is stored on the non-transitory computer-readable storage medium; and the computer program is configured to be executed by a processor to implement the above method.

Compared with the prior art, this disclosure has the following advantages.

The target analysis tool is determined according to the to-be-solved problem. The initial model corresponding to the to-be-solved problem is generated based on the target analysis tool. The target model corresponding to the initial model is determined according to the interaction relationship between the plurality of first elements and the second element. The problem characterization result of the target model is generated according to the preset interaction relationship. The retrieval information is generated according to the problem characterization result. The retrieval is performed in the preset database according to the retrieval information to obtain the target data. The target data is recommended to the user as the solution to the to-be-solved problem. In this way, different analysis tools can be used to analyze different to-be-solved problems. In addition, the retrieval is performed based on the problem characterization result obtained by analysis to obtain the solution to the to-be-solved problem, such that the to-be-solved problem can be better understood by a designer, thereby reducing the solving difficulty and improving the solving efficiency.

BRIEF DESCRIPTION OF THE DRAWINGS

In order to make the technical solutions of embodiments of the present disclosure clearer, the accompanying drawings required in the description of the embodiments will be briefly described below. It should be understood that presented in the drawings are merely some embodiments of the disclosure, and are not intended to limit the scope of the present in disclosure. For those of ordinary skill in the art, other drawings can be obtained based on the drawings of the disclosure without making creative efforts.

DETAILED DESCRIPTION OF EMBODIMENTS

Figure 1:
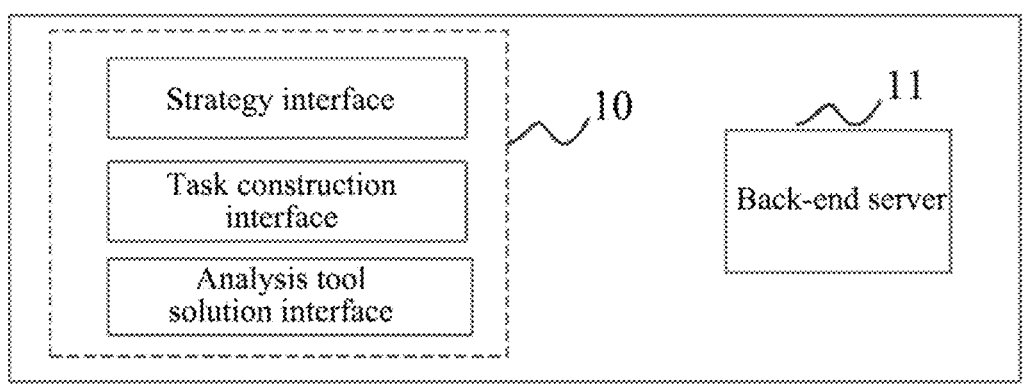
FIG. 1 is a schematic structural diagram of a solution recommendation system in accordance with an embodiment of the present disclosure.

In order to make the purpose, technical solutions and advantages of the present disclosure clearer, the present disclosure will be further described in detail below in conjunction with the accompanying drawings and the embodiments. It should be understood that the drawings in this application are merely illustrative and descriptive, and are not intended to limit the scope of the disclosure. Additionally, it should be understood that the illustrative drawings are not drawn to scale. The flow charts provided herein illustrate operations implemented in accordance with some embodiments of the disclosure. It should be understood that the implementation sequence of the operations is not limited to that shown in the drawings, and steps without logical contextual relationships can be implemented in a reverse order or simultaneously. In addition, those of ordinary skill in the art can add one or more other operations to the flow charts, or remove one or more operations from the flow charts under the guidance of the content of this application.

Moreover, described below are merely some embodiments of the present disclosure, instead of all embodiments of the present disclosure. The components in the embodiments of the disclosure described and illustrated in the drawings can be arranged and designed in a variety of different configurations. Accordingly, the following detailed description of the embodiments provided in the accompanying drawings is not intended to limit the scope of the present disclosure, but rather to represent selected embodiments of the present disclosure. Based on the embodiments of this application, all other embodiments obtained by those of ordinary skill in the art without making creative efforts shall fall within the scope of the present disclosure.

It should be noted that the term "comprise" used in the embodiments of this disclosure is intended to indicate the existence of features declared thereafter, but not to exclude the addition of other features.

FIG. 1 is a schematic structural diagram of a problem-solving recommendation system. As shown in FIG. 1, the problem-solving recommendation system is applied to an electronic device. The electronic device can be, for example, a desktop computer, a notebook computer, or other terminal device with a computing processing capability and a display function. The electronic device can include a front-end interface 10 and a back-end server 11.

The front-end interface 10 can include a strategy interface, a task construction interface and an analysis tool solution interface.

A user can select a strategy, input a to-be-solved problem, select a problem process of the to-be-solved problem, and click knowledge retrieval on the front-end interface. Selection and execution of a target analysis tool can be performed on the analysis tool solution interface. The back-end server 11 can act as a server to perform operations such as problem analysis, problem characterization and knowledge retrieval in a background.

Figure 2:
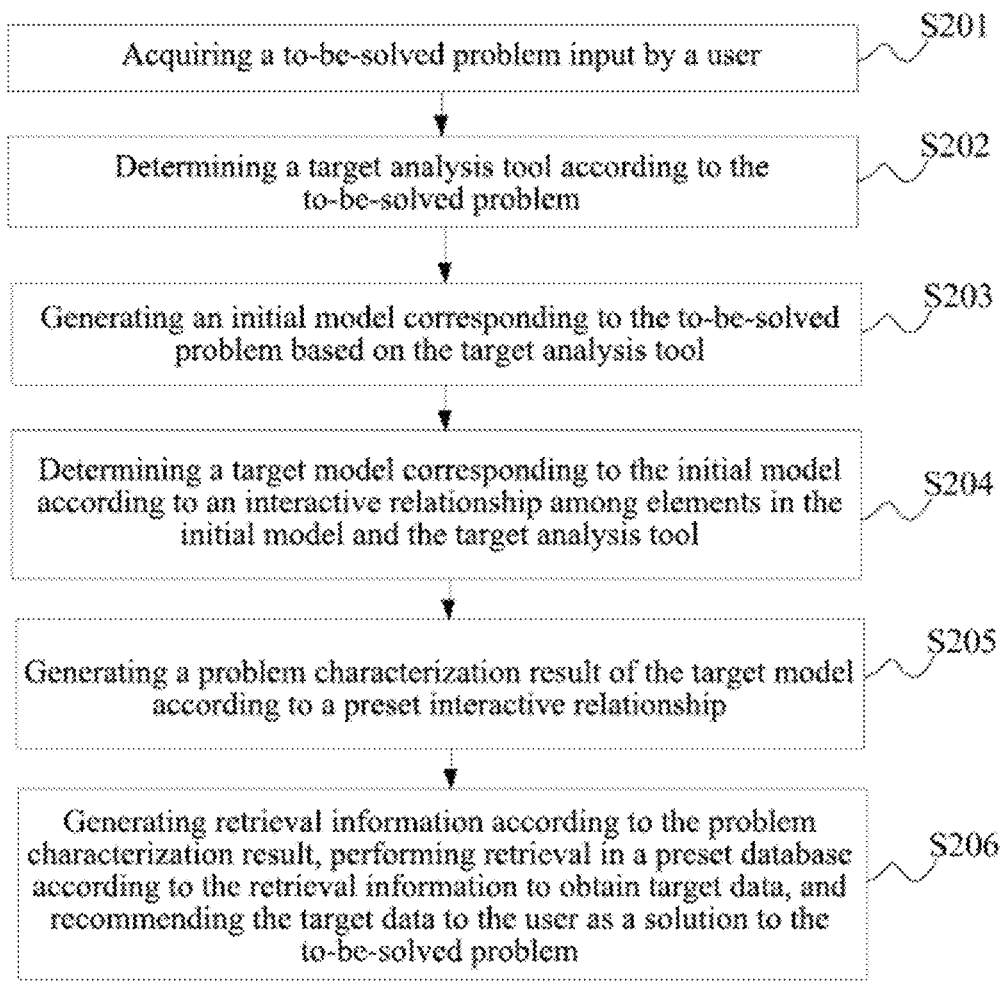
FIG. 2 is a flow chart of a solution recommendation method in accordance with an embodiment of the present disclosure.

FIG. 2 is a flow chart of a problem-solving recommendation method. An execution subject of the problem-solving recommendation method is the above electronic device. As shown in FIG. 2, the problem-solving recommendation method includes the following steps.

(S201) The to-be-solved problem input by the user is acquired.

The to-be-solved problem can refer to a problem encountered by the user in a process of designing and using a product, such as "how to solve a problem of uneven temperature in a sintering furnace", "how to solve a problem of wheel durability", etc.

Specifically, the user can select any strategy in the strategy interface and fill in information of the to-be-solved problem. Specifically, the user can fill in a brief description or a detailed description of the to-be-solved problem. The strategy can include a problem-oriented strategy, a goal-oriented strategy, a product-oriented strategy and a carrier-oriented strategy.

(S202) The target analysis tool is determined according to the to-be-solved problem.

Specifically, the target analysis tool can be determined according to information such as the description of the to-be-solved problem. The target analysis tool refers to a tool for analyzing the to-be-solved problem.

Each analysis tool can analyze one type of problem. For example, for 11 types of problems, 11 types of analysis tools can be provided.

(S203) An initial model corresponding to the to-be-solved problem is generated according to the target analysis tool.

The initial model can be configured to characterize a plurality of first elements related to the to-be-solved problem and an interaction relationship the plurality of first elements and a second element input by the user.

In an embodiment, in the initial model, the plurality of first elements can be connected to each other. Specifically, a connection can be made based on the interaction relationship. If there is an interaction relationship between element 1 and element 2, then element 1 is connected to element 2.

In an embodiment, if the to-be-solved problem is a problem that requires to be solved for a certain workpiece, the plurality of first elements can refer to other components that affect the problem of the workpiece and the workpiece itself, and there is an interaction relationship between the components and the workpiece, which can include, for example, a harmful, insufficient, excessive, standard, etc. interaction relationship.

(S204) A target model corresponding to the initial model is obtained according to the interaction relationship in the initial model and the target analysis tool.

In an embodiment, the interaction relationship and the plurality of first elements can be analyzed using the target analysis tool, so as to obtain the target model.

In an embodiment, some interaction relationships that need to be clipped and each element connected to these interaction relationships can be clipped using the target analysis tool to obtain a clipped initial model as the target model.

(S205) A problem characterization result of the target model is generated according to a preset interaction relationship.

Specifically, the preset interaction relationship and elements connected to the preset interaction relationship can be selected from the target model to generate the problem characterization result.

The problem characterization result can refer to characterizing the to-be-solved problem as a conflict characterization problem, a function characterization problem, a parameter characterization problem or an emotion characterization problem.

(S206) Retrieval information is generated according to the problem characterization result. Retrieval is performed in a preset database according to the retrieval information to obtain target data. The target data is recommended to the user as a solution to the to-be-solved problem.

In an embodiment, a keyword can be extracted from the problem characterization result to generate the retrieval information, and the retrieval is performed in the preset database based on the retrieval information to obtain the target data. The target data can refer to data related to the to-be-solved problem in the preset database, and retrieved target data is returned to the front-end interface as the solution to the to-be-solved problem and displayed to the user.

In this embodiment, the target analysis tool is determined according to the to-be-solved problem. The initial model corresponding to the to-be-solved problem is generated based on the target analysis tool. The target model corresponding to the initial model is determined according to the interaction relationship and the target analysis tool. The problem characterization result of the target model is generated according to the preset interaction relationship. The retrieval information is generated according to the problem characterization result. The retrieval is performed in the preset database according to the retrieval information to obtain the target data. The target data is recommended to the user as the solution to the to-be-solved problem. In this way, different analysis tools can be used to analyze different to-be-solved problems. In addition, the retrieval is performed based on the problem characterization result obtained by analysis to obtain the solution to the to-be-solved problem, such that the to-be-solved problem can be better understood by a designer, thereby reducing problem-solving difficulty and improving problem-solving efficiency.

In an embodiment, the step (S202) can include the following steps.

In an embodiment, the to-be-solved problem is subjected to word segmentation to obtain the keyword, and the target analysis tool is determined according to a word type of the keyword.

The keyword can be, for example, a verb, a noun, a causal relationship word, a competitiveness word, etc.

Specifically, if the keyword is present in the preset database, whether the keyword belongs to a preset word type is determined, and the target analysis tool is determined according to the word type of the keyword. Words in the preset database can include different types of words such as function words, action words and structural words.

In an embodiment, the determination of the target analysis tool according to the word type of the keyword is performed through the following steps.

If the keyword belongs to the preset word type, the target analysis tool is determined according to the keyword.

In an embodiment, the determination of the target analysis tool according to the keyword is performed through the following steps.

In an embodiment, if the keyword belongs to a combination of a verb and a noun, and includes the causal relationship word, the target analysis tool is determined according to the number of the verb.

The combination of the verb and the noun can be, for example, making noise and forming vortex. The causal relationship word can be, for example, due to, because and so.

Specifically, if the keyword belongs to the combination of the verb and the noun, includes the causal relationship word, and the number of verbs in the keyword is greater than 1, the target analysis tool is determined as a function-structure analysis tool. If the number of the verb in the keyword is less than 1, the target analysis tool is configured for function-oriented search.

In an embodiment, if the keyword belongs to the combination of the verb and the noun, includes the competitiveness word, and is free of the causal relationship word, the target analysis tool is determined based on whether the keyword includes a future word and whether the keyword includes a coordination word.

The competitiveness word can be, for example, a word indicating market competitiveness such as occupying the market. The future word can be, for example, a word indicating the future such as outlook, future, etc. The coordination word can be, for example, a word indicating coordination such as assistance, auxiliary and help.

Specifically, if the keyword belongs to the combination of the verb and the noun, includes the competitiveness word and the future word, and is free of the causal relationship word, the target analysis tool is determined as an evolutionary potential analysis tool.

If the keyword belongs to the combination of the verb and the noun, includes the competitiveness word and the coordination word, and is free of the causal relationship word and the future word, the target analysis tool is determined as a creative template method.

If the keyword belongs to the combination of the verb and the noun, includes the competitiveness word, and is free of the causal relationship word, the future word and the coordination word, the target analysis tool is configured for checklist analysis.

In an embodiment, if the keyword belongs to the combination of the verb and the noun, includes a factor word, and is free of the causal relationship word and the competitiveness word, the target analysis tool is determined as a fishbone diagram and a fault tree.

The factor word can be, for example, a word related to a characteristic factor such as personnel, machinery, materials, environment and testing.

In an embodiment, if the keyword belongs to the combination of the verb and the noun, and does not include the causal relationship word, the competitiveness word and the factor word, the target analysis tool is determined based on whether the keyword includes a technical feature word and whether the keyword includes a structural word.

The technical feature word can be, for example, reliability and efficiency. The structural word can be, for example, a heating rod and a sealing ring.

Specifically, if the keyword belongs to the combination of the verb and the noun, includes the technical feature word or the structural word, and is free of the causal relationship word, the competitiveness word and the factor word, the target analysis tool is determined as a functional component analysis tool.

If the keyword belongs to the combination of the verb and the noun, and does not include the causal relationship word, the competitiveness word, the factor word, the technical feature word and the structural word, the target analysis tool is determined as a causal analysis tool.

In an embodiment, if the keyword is an adjective, the target analysis tool is determined according to a type of the adjective. Specifically, if the adjective is an appearance word, the target analysis tool is configured for appearance vocabulary retrieval. If the adjective is an emotion-type word, the target analysis tool is configured for emotional vocabulary retrieval.

It is worth noting that the determination of the target analysis tool based on the keyword can be automatically identified and determined by an electronic device.

Figure 3:
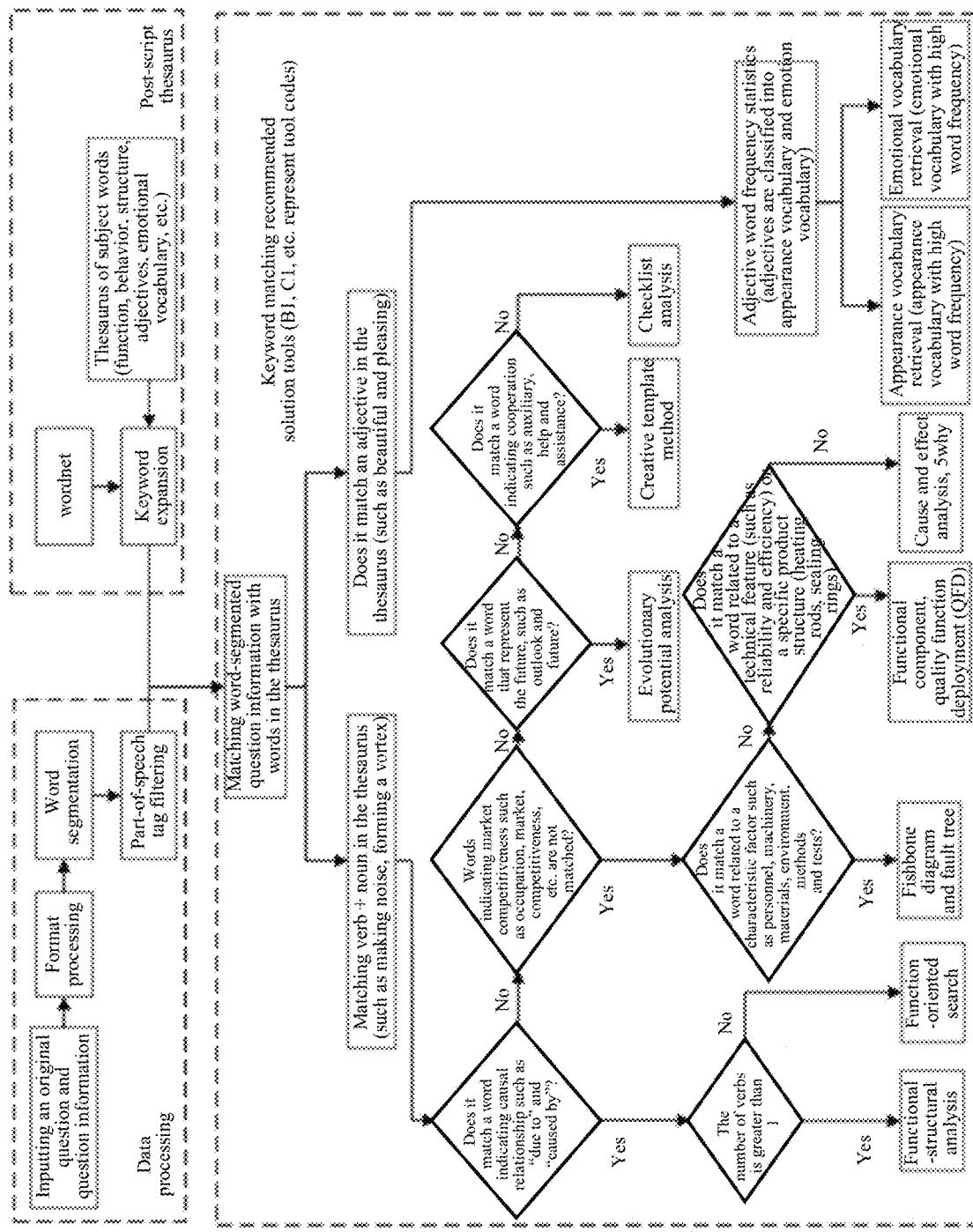
FIG. 3 is a flow chart for determining a target analysis tool in accordance with an embodiment of the present disclosure.

In order to more clearly demonstrate a process of determining the target analysis tool, FIG. 3 is used for detailed description. FIG. 3 is a flow chart of determining the target analysis tool, the steps of which have been illustrated in the embodiments described above and will not be repeated herein.

Figure 4:
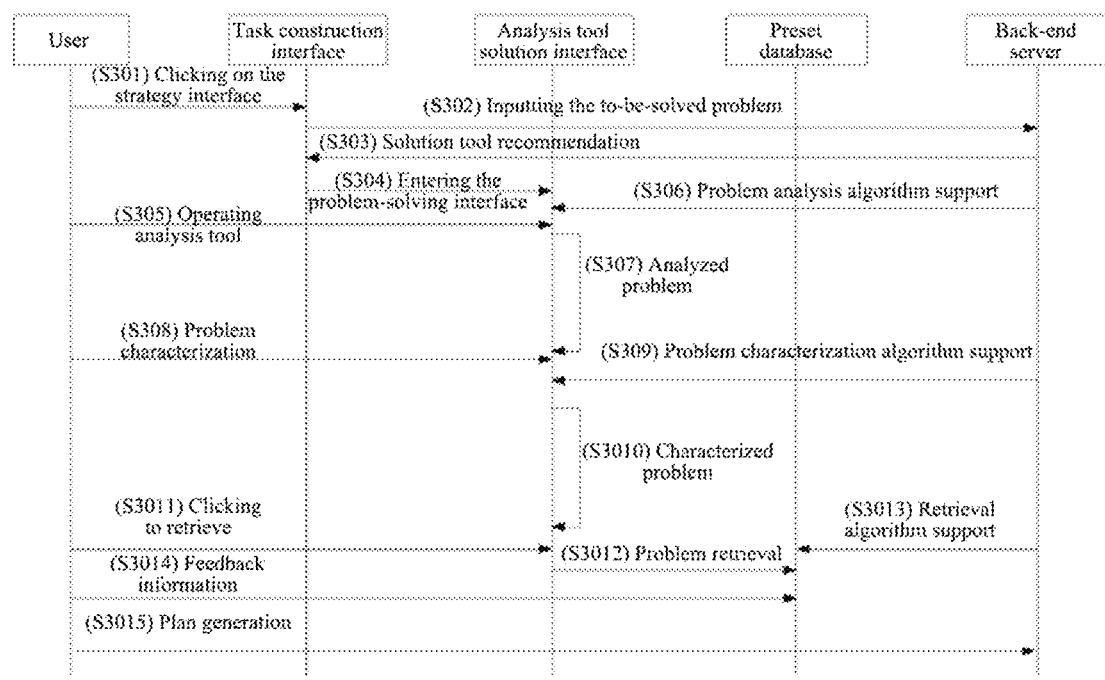
FIG. 4 shows a complete time sequence graph in accordance with an embodiment of the present disclosure.

In addition, the interactive operation between the user and the electronic device is shown in FIG. 4, which is a complete time sequence graph, showing the following steps.

(S301) The strategy interface is clicked by the user to select any one strategy.

(S302) The to-be-solved problem is input by the user on the task construction interface, and saved to the back-end server.

(S303) A solving tool is recommended, which refers to the above process of determining the target analysis tool according to the word type of the keyword.

(S304) A problem solving interface is entered.

(S305) The analysis tool is operated by the user.

(S306) Problem analysis algorithm support is provided by the back-end server to the analysis tool, and the to-be-solved problem is analyzed by the analysis tool according to the problem analysis algorithm.

(S307) An analyzed problem is obtained.

(S308) A problem characterization operation is performed by the user on the front-end interface.

(S309) Problem characterization algorithm support is provided by the back-end server to the analysis tool, and the analyzed problem is characterized by the analysis tool according to the problem characterization algorithm.

(S3010) A characterized problem is obtained.

(S3011) The retrieval is clicked by the user, which means that a retrieval is operated by the user on a solution interface of the analysis tool according to the characterized problem.

(S3012) Problem retrieval is performed by the analysis tool according to the user's retrieval operation.

(S3013) Retrieval algorithm support is provided by the back-end server.

(S3014) Retrieval is performed in the preset database according to the retrieval algorithm support, so as to obtain retrieval feedback information.

The feedback information refers to the above target data.

(S3015) The solution to the to-be-solved problem is generated according to the feedback information.

It is worth noting that any analysis tool in this embodiment can generate the initial model of the analysis tool based on the to-be-solved problem input into the analysis tool. The process of generating the initial model by the functional component analysis tool is shown in FIG. 5.

Figure 5:
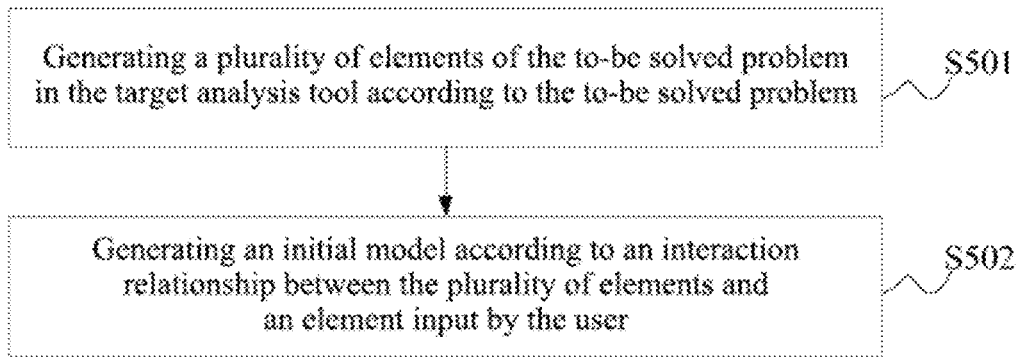
FIG. 5 is a flow chart of generating an initial model in accordance with an embodiment of the present disclosure.

FIG. 5 is a flow chart of generating the initial model. As shown in FIG. 5, the step (S203) can be performed through the following steps.

(S501) The plurality of first elements of the to-be-solved problem is generated in the target analysis tool according to the to-be-solved problem.

The plurality of first elements can be configured to characterize a factor affecting the to-be-solved problem.

In an embodiment, when the target analysis tool is the functional component analysis tool, the plurality of first elements can include an action object corresponding to the to-be-solved problem, at least one system component and a supersystem component. The action object can indicate an action object of a product system that needs to be solved. For example, if the to-be-solved problem is a problem that needs to be solved for a certain workpiece, the action object will be said workpiece. The at least one system component can refer to factor components related to the to-be-solved problem, that is, those can have an impact on the to-be-solved problem. For example, if the to-be-solved problem is "how to solve the problem of uneven temperature in the sintering furnace", the at least one system component can be an air inlet, a gas, a support column, an insulation layer or a heating ring. The supersystem component can refer to a system factor corresponding to the to-be-solved problem, which means that the supersystem component has an important impact on the to-be-solved problem. For example, if the atmospheric environment affects the workpiece, the supersystem component can be the atmospheric environment.

(S502) The initial model is generated according to the interaction relationship between the plurality of first elements and the second element input by the user.

Figure 6:
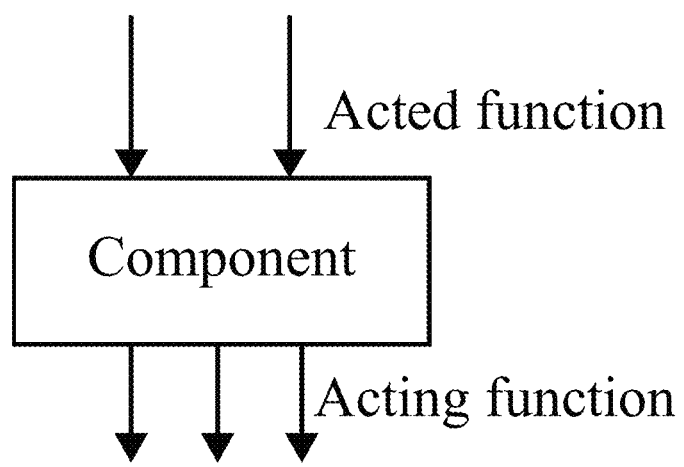
FIG. 6 is a schematic diagram of a component in accordance with an embodiment of the present disclosure.

Each element in the initial model can characterize a component respectively, and the interaction relationship among the elements is configured to characterize a interaction relationship among components. A component can include an acting function and an acted function. The acted function refers to an interaction relationship of other components to said component, and the acting function refers to an interaction relationship of said component to other components. For example, as shown in FIG. 6, said component includes the acting function and the acted function. Therefore, each component can be connected to each other according to the acting function of each component on other components and the acted function of other components on each component, so as to obtain a relationship diagram of each component as the initial model.

Figure 7:
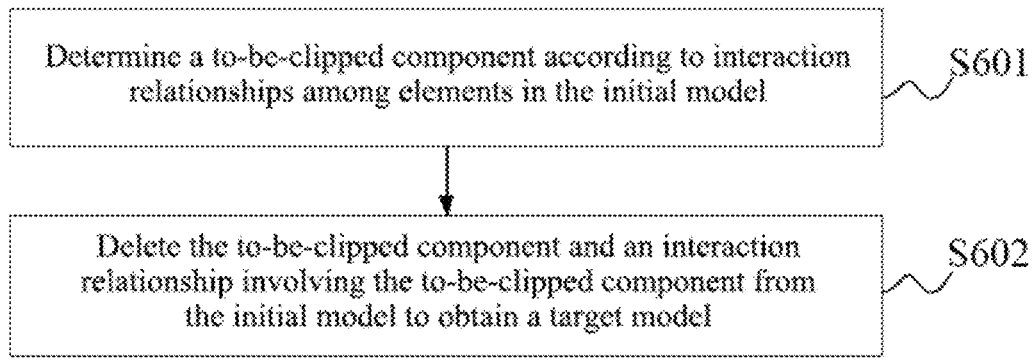
FIG. 7 is a flow chart of determining a target model in accordance with an embodiment of the present disclosure.

FIG. 7 is a flow chart of determining the target model. As shown in FIG. 7, the step (S204) can be performed through the following steps.

The functional component analysis tool is configured as the target analysis tool. For such functional component analysis tool, the initial model can be clipped, and a clipped initial model can be configured as the target model of the initial model.

(S601) A to-be-clipped element is determined among the plurality of first elements according to the interaction relationship between the plurality of first elements and the second element.

In an embodiment, the interaction relationship includes a harmful, insufficient, excessive or standard role. Each element can have multiple interaction relationships, that is, for one element, there can be a plurality of different elements that have acted functions on said element, and said element can also have an acting function on the plurality of different elements. For a gas element, a heating rod element can have a heating function on the gas, a graphite box can have a uniform function on the gas, an air inlet can have a uniform function on the gas, and the gas can have a discharge function on a wax gas. Therefore, the to-be-clipped element can be determined using a preset method according to the plurality of first elements and the interaction relationship.

(S602) The to-be-clipped element and the interaction relationship involving the to-be-clipped element are deleted from the initial model to obtain the target model.

In an embodiment, after the to-be-clipped element is determined, the to-be-clipped element and the interaction relationship thereof can be deleted using a preset clipping rule, that is, when deleting the to-be-clipped element, the acting function and the acted function of the to-be-clipped element are also need to be deleted.

The preset clipping rule can be as follows. Operations on the acting function can include 1) an effective acting function is implemented by other components in the model; 2) an acted component is removed; 3) the effective acting function is deleted; and 4) the effective acting function is implemented by an external component. The clipping of the acting function can be customized according to these four operations. Operations on the acted function can include 1) the acted function is deleted; 2) the acted function is implemented by other components in the model. The clipping of the acted function can be customized according to these two operations. The super system component and an action object thereof cannot be configured as a to-be-clipped component.

In an embodiment, the step (S601) can be performed through the following steps.

In an embodiment, elements in the initial model are traversed. For a traversed current element, an importance score of the current element is determined according to a type of the current element and an interaction relationship thereof, and a clipping coefficient of the current element is determined according to the importance score.

In an embodiment, the to-be-clipped element is determined according to clipping coefficients of the elements in the initial model.

Specifically, the clipping coefficients of the elements in the initial model can be sorted to obtain sorted clipping coefficients, and an element with the smallest clipping coefficient is configured as the to-be-clipped element.

In the above functional component analysis tool, said element can refer to the component.

Figure 8:
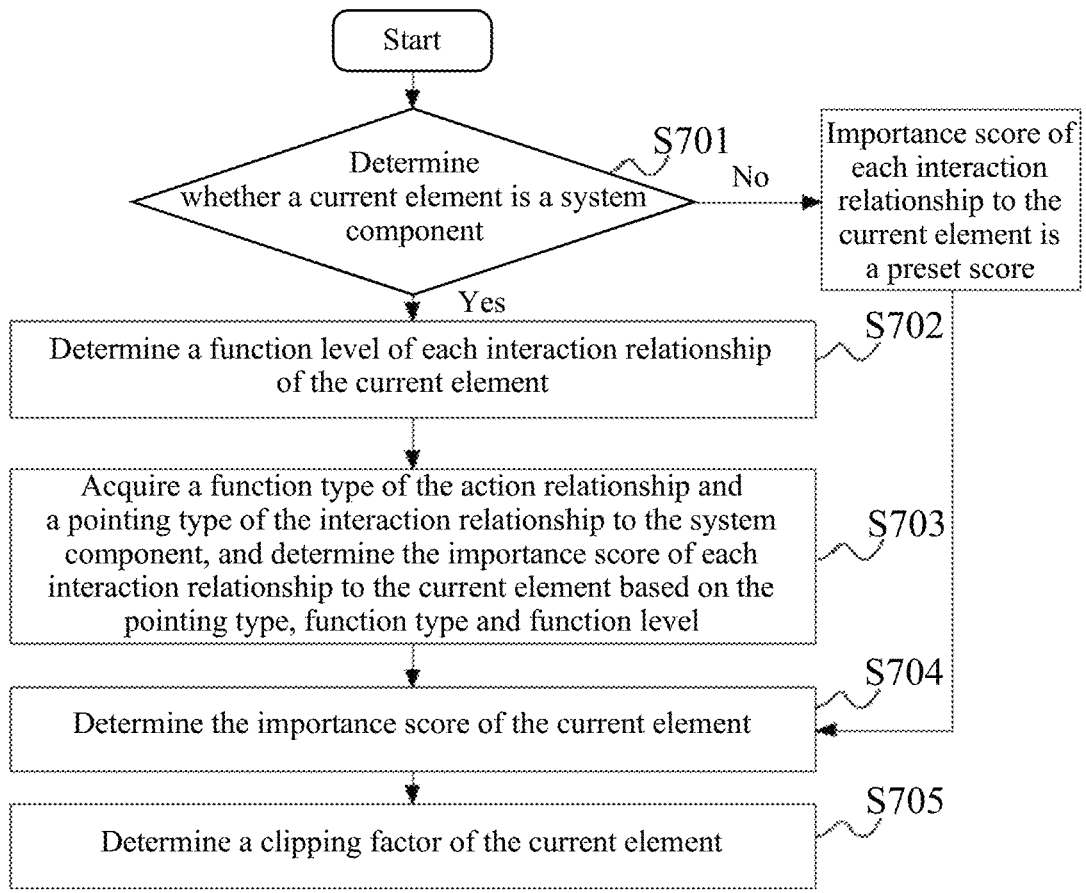
FIG. 8 is a flow chart of determining a clipping coefficient of individual elements in accordance with an embodiment of the present disclosure.

FIG. 8 is a flow chart of determining the clipping coefficient of each element. As shown in FIG. 8, the determination of the clip coefficient of the current element according to the importance score is performed through the following steps.

The functional component analysis tool is configured as the target analysis tool. For such functional component analysis tool, the initial model can be clipped, and the clipped initial model can be configured as the target model of the initial model.

(S701) The current element is determined as a system component or not.

If yes, step (702) is executed.

If not, step (704) is executed, that is, if the type of the current element is the action object, the importance score of the interaction relationship for the current element is configured as a preset score, which is greater than the importance score of each functional element. The preset score can be recorded as: $A=2*B_1$, where $B_1$ refers to a maximum function level.

(S702) A function level of the interaction relationship of the current element is determined.

Specifically, if the type of the current element is the system component, the function level of the interaction relationship is determined according to hierarchical information of the interaction relationship of the current element. The function level of the interaction relationship is related to a hierarchy of the same, which refers to a distance hierarchy from the action object in the component. The further away from the action object in the component, the higher the hierarchy of the interaction relationship. The function level of the interaction relationship can be represented by $B_i$.

The current element can include multiple interaction relationships, and then the function level of multiple interaction relationships is determined.

If $B_{imax}=1$, it means that the function level corresponding to a largest hierarchy of the interaction relationship is 1, and the interaction relationship of the supersystem component is not assigned a value.

(S703) A function type of the interaction relationship and a pointing type of the same for the system component are acquired. The importance score of each interaction relationship for the current element is determined according to the pointing type, the function type and the function level.

The function type of the interaction relationship can include a harmful function type, an insufficient function type, a useful function type and an excessive function type. An importance score of the harmful function type to the system component can be recorded as fixed data h. An importance of the useful function type to the system component is expressed as: $X_j=B_i$, where $X_j$ is the importance of the interaction relationship to the system component. An importance of the insufficient function type or the excessive function type is expressed as: $X_j=0.5*B_i$.

In an embodiment, after the function type of the system component is determined, the importance of the interaction relationship to the element is determined according to the pointing type of the interaction relationship to the system component. The pointing type can mean that the interaction relationship points to or deviates from the system component. If the pointing type is a type pointing to the system component, the importance of the interaction relationship to the system component is the importance of the above function type to the system component, which is $X_j$. If the pointing type is a type deviating from the system component, the importance of the interaction relationship to the system component is the importance of the above function type to the system component multiplied by 0.5, which is $0.5*X_j$.

(S704) The importance score of the current element is determined.

When the importance of each interaction relationship of an element to the element is obtained according to the above method, a sum of the importance of each interaction relationship of the element to the element can be calculated as: $C=\Sigma_{j=1}^{n}X_{j}$, that is, the importance score of the element can be obtained, where C is the importance score of the current element, and n is the number of interaction relationships of the current element.

(S705) The clipping coefficient of the current element is determined.

In an embodiment, the clipping coefficient of the current element is determined according to the importance score and the number of negative interaction relationships of the current element. The negative interaction relationships can refer to harmful interaction relationships produced by the element. For example, an element produces two harmful interaction relationships, which means that the element includes two harmful interaction relationships deviating from the element.

Specifically, the clipping coefficient of the current element can be calculated as: $\beta=C/N_h$, where C is the importance score of the current element, and $N_h$ is the number of the negative interaction relationships generated by the current element.

In this embodiment, the importance of each element can be determined according to the importance of the interaction relationship, such that the clip of elements can be more reasonable, thereby allowing the obtained target model and the problem characterization obtained according to the target model to be more accurate, so as to enable the knowledge retrieved according to the problem characterization to be more consistent with the solution to the to-be-solved problem.

In an embodiment, the step (S205) can be performed through the following steps.

In an embodiment, at least one element and at least one interaction relationship are extracted from the target model according to a preset interaction relationship. A first problem characterization is generated according to at least one extracted element and at least one extracted interaction relationship. The preset interaction relationship can be, for example, a harmful interaction relationship, an insufficient interaction relationship or an excessive interaction relationship.

In an embodiment, multiple elements and multiple interaction relationships among the multiple elements can be present in the target model. A first problem characterization result of the target model can be generated according to the preset interaction relationship and a component connected to the preset interaction relationship, such as "A sealing effect of a furnace door on a graphite box is insufficient, how to improve the sealing effect of the furnace door on the graphite box".

The first problem characterization can include a harmful effect problem characterization, for example, A has a harmful effect on B, how to eliminate the harmful effect of A on B. The first problem characterization can further include an insufficient effect problem characterization, for example, A has an insufficient effect on B, how to improve the effect of A on B. The first problem characterization can further include an excessive effect problem characterization, for example, A has an excessive effect on B, how to reduce the effect of A on B.

In an embodiment, a second problem characterization result is generated according to the first problem characterization result and a response input by the user according to a preset question list. The preset question list can be preset according to the first problem characterization result, and can allow the user to input the response according to each question in the preset question list, such that the first problem characterization result is re-characterized according to the response to generate the second problem characterization result.

The second problem characterization result can be a conflict problem characterization, a functional problem characterization, a parameter problem characterization and an emotional problem characterization. The conflict problem characterization can be, for example, improving or reducing a functional parameter, specifically, improving parameter power and reducing parameter stability. The functional problem characterization can be a functional verb plus a functional noun, such as rotating to fix. The parameter problem characterization can be a functional verb plus a parameter, such as increasing intensity. The emotional problem characterization can be an emotional word, such as durable, pleasant, etc.

Figure 9:
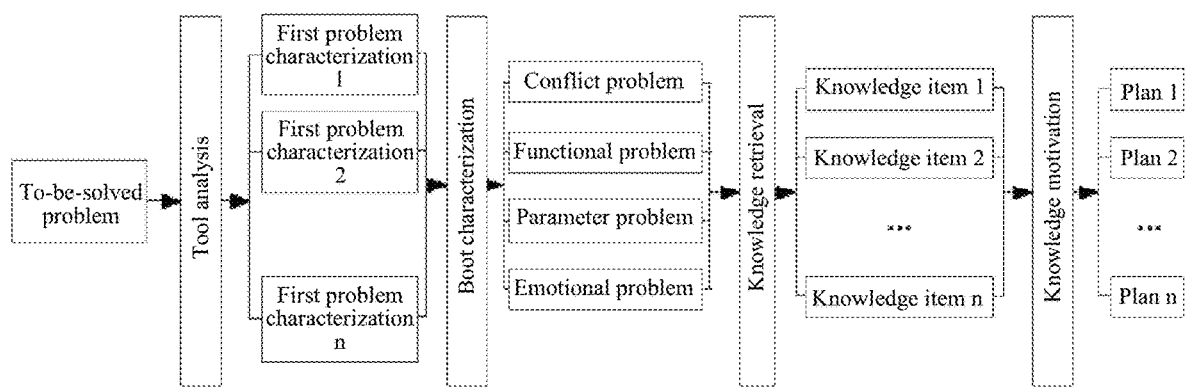
FIG. 9 is a flow chart of a problem characterization and solution process in accordance with an embodiment of the present disclosure.

FIG. 9 is a flow chart of a problem characterization and solution process. As shown in FIG. 9, after the to-be-solved problem is input by the user, the to-be-solved problem is analyzed by the analysis tool using the above method to obtain the first problem characterization result, and further obtain the second problem characterization result. The keyword is selected from the second problem characterization result to perform knowledge retrieval, thereby obtaining the target data. The solution to the to-be-solved problem is determined according to the target data.

Figure 10:
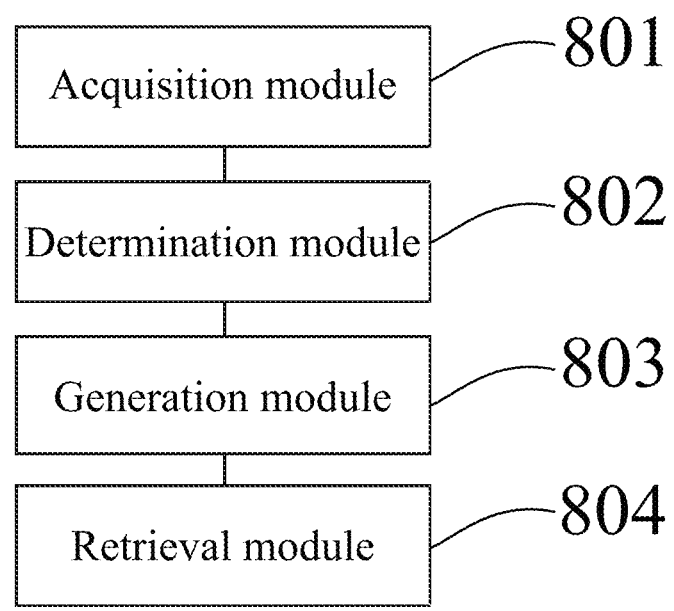
FIG. 10 is a schematic diagram of a solution recommendation device in accordance with an embodiment of the present disclosure.

FIG. 10 is a schematic diagram of a problem-solving recommendation system. As shown in FIG. 10, the system includes an acquisition module 801, a first determination module 802, a first generation module 803, a second determination module 804, a second generation module 805 and a retrieval module 806. The acquisition module 801 is configured to acquire a to-be-solved problem input by a user. The first determination module 802 is configured to determine a target analysis tool according to the to-be-solved problem. The first generation module 803 is configured to generate an initial model corresponding to the to-be-solved problem based on the target analysis tool, where the initial model is configured to characterize a plurality of first elements related to the to-be-solved problem and an interaction relationship between the plurality of first elements and a second element input by the user. The second determination module 804 is configured to determine a target model corresponding to the initial model according to the interaction relationship and the target analysis tool. The second generation module 805 is configured to generate a problem characterization result of the target model according to a preset interaction relationship. The retrieval module 806 is configured to generate retrieval information according to the problem characterization result, perform retrieval in a preset database according to the retrieval information to obtain target data, and recommend the target data to the user as a solution to the to-be-solved problem.

In an embodiment, the first determination module 802 is specifically configured to perform word segmentation on the to-be-solved problem to obtain a keyword of the to-be-solved problem, and determine the target analysis tool according to a word type of the keyword.

In an embodiment, the first determination module 802 is specifically configured to determine the target analysis tool according to the keyword if the keyword belongs to a preset word type.

In an embodiment, the first determination module 802 is specifically configured to determine the target analysis tool according to the number of a verb if the keyword belongs to a combination of the verb and a noun and includes a causal relationship word, determine the target analysis tool based on whether the keyword includes a future word or a coordination word if the keyword belongs to the combination of the verb and the noun, includes a competitiveness word, and is free of the causal relationship word, determine the target analysis tool based on whether the keyword includes a factor word if the keyword belongs to the combination of the verb and the noun and does not include the causal relationship word and the competitiveness word, determine the target analysis tool based on whether the keyword includes a technical feature word or a structural word if the keyword belongs to the combination of the verb and the noun and does not include the causal relationship word, the competitiveness word and the factor word, and determine the target analysis tool according to a type of the adjective if the keyword is an adjective.

In an embodiment, the first generation module 803 is specifically configured to generate the plurality of first elements in the target analysis tool according to the to-be-solved problem, and generate the initial model according to the interaction relationship between the plurality of first elements and the second element, where the plurality of first elements are configured to characterize a factor affecting the to-be-solved problem.

In an embodiment, the second generation module 805 is specifically configured to extract at least one element and at least one interaction relationship from the target model according to the preset interaction relationship, generate a first problem characterization result according to at least one extracted element and at least one extracted interaction relationship, and generate a second problem characterization result based on the first problem characterization result and a response input by the user in accordance with a preset question list.

Figure 11:
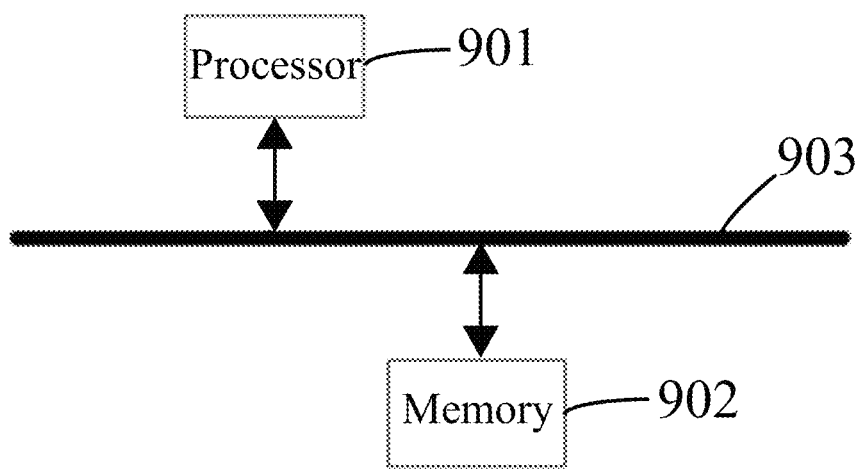
FIG. 11 is a block diagram of an electronic device in accordance with an embodiment of the present disclosure.

FIG. 11 is a block diagram of an electronic device 900. As shown in FIG. 11, the electronic device 900 can include a processor 901 and a memory 902.

In an embodiment, the electronic device 900 can further include a bus 903. The memory 902 is configured to store a machine-readable instruction executable by the processor 901. When the electronic device 900 is running, the processor 901 is communicated with the memory 902 through the bus 903. The machine-readable instruction is configured to be executed by the processor 901 to implement the above method.

A non-transitory computer-readable storage medium is also provided. A computer program is stored on the non-transitory computer-readable storage medium, and is configured to be executed by a processor to implement the above method.

It can be understood by those skilled in the art that for the convenience and simplicity of description, specific operating processes of the system and device described above can be referred to the corresponding processes of the above method, and will not be described again in this application. In the embodiments provided in this application, it should be understood that the systems, devices and methods provided herein can be implemented in other ways. The above devices are merely illustrative. For example, the division of modules is only a logical function division. In practical implementation, there may be other ways of division. For example, multiple modules or components can be combined or integrated into another system, or some features can be omitted, or not implemented. On the other hand, the coupling, direct coupling or communication connection between each other shown or discussed herein can be realized through some communication interfaces, and the indirect coupling or communication connection of the devices or modules can be in electrical, mechanical or other forms.

In addition, each functional unit described in the embodiments can be integrated into one processing unit, or exist independently, or two or more units can be integrated into one unit. If the function is implemented in a form of a software functional units and sold or used as an independent product, it can be stored in a computer-readable storage medium. Based on such understanding, the technical solutions of the present disclosure, or a part thereof contributing to the prior art, or a part of the technical solutions can be embodied in a form of a software product. The computer software product is stored in a storage medium and includes a plurality of instructions to allow a computer device (which can be a personal computer, a server, or a network device, etc.) to execute all or part of the steps of the methods described in various embodiments of this application. The above storage medium includes a U disk, a mobile hard disk, a read-only memory (ROM), a random-access memory (RAM), a magnetic disk, an optical disk and other medium that can store program code.

The embodiments described above are merely illustrative of the present disclosure, and are not intended to limit the patent scope of the present disclosure. Various modifications and replacements made by those skilled in the art without departing from the spirit of the disclosure shall fall within the scope of the present disclosure defined by the appended claims.

What is claimed is:

1. A method for strategically solving an innovative design problem, comprising:
   step (1) acquiring a to-be-solved problem input by a user via user interface (UI);
   step (2) determining a target analysis tool according to the to-be-solved problem;
   step (3) generating an initial model corresponding to the to-be-solved problem based on the target analysis tool; wherein the initial model is configured to characterize a plurality of first elements related to the to-be-solved problem and an interaction relationship between the plurality of first elements and a second element input by the user via UI;
   step (4) determining a target model corresponding to the initial model according to the interaction relationship and the target analysis tool;
   step (5) generating a problem characterization result of the target model automatically according to a preset interaction relationship; and
   step (6) in response to the use's trigger via UI, generating retrieval information according to the problem characterization result, performing retrieval in a preset database according to the retrieval information to obtain target data, and recommending the target data to the user via UI as a solution to the to-be-solved problem;
   wherein the step (3) is performed through steps of:
   (3.1) generating the plurality of first elements in the target analysis tool according to the to-be-solved problem; wherein the plurality of first elements are configured to characterize a factor affecting the to-be-solved problem; and
   (3.2) generating the initial model according to the interaction relationship between the plurality of first elements and the second element;

the step (4) is performed through steps of:
(4.1) determining a to-be-clipped element among the plurality of first elements according to the interaction relationship, and clipping the initial model in the target analysis tool; and
(4.2) deleting the to-be-clipped element and an interaction relationship involving the to-be-clipped element from the initial model to obtain the target model;
the step (5) is performed through steps of:
(5.1) extracting at least one element and at least one interaction relationship from the target model according to the preset interaction relationship, and generating a first problem characterization result according to at least one extracted element and at least one extracted interaction relationship; and
(5.2) generating a second problem characterization result based on the first problem characterization result and a response input by the user via UI in accordance with a preset problem list.

2. The method of claim 1, wherein the step (2) is performed through steps of:
step (2.1) subjecting the to-be-solved problem to word segmentation to obtain a keyword of the to-be-solved problem; and
step (2.2) determining the target analysis tool according to a word type of the keyword.

3. The method of claim 2, wherein the step (2.2) is performed through a step of:
if the keyword belongs to a preset word type, determining the target analysis tool according to the keyword.

4. The method of claim 3, wherein the step of determining the target analysis tool according to the keyword comprises:
if the keyword belongs to a combination of a verb and a noun, and comprises a causal relationship word, determining the target analysis tool according to the number of the verb;
if the keyword belongs to the combination of the verb and the noun, comprises a competitiveness word, and is free of the causal relationship word, determining the target analysis tool based on whether the keyword comprises a future word and whether the keyword comprises a coordination word;
if the keyword belongs to the combination of the verb and the noun, and does not comprise the causal relationship word and the competitiveness word, determining the target analysis tool based on whether the keyword comprises a factor word;
if the keyword belongs to the combination of the verb and the noun, and does not comprise the causal relationship word, the competitiveness word and the factor word, determining the target analysis tool based on whether the keyword comprises a technical feature word or a structural word; and
if the keyword is an adjective, determining the target analysis tool according to a type of the adjective.

5. A system for strategically solving an innovative design problem comprising: a computing system having a memory and a processor, the computing system having a set of modules stored on the memory and processed by the processor, the modules comprising:
an acquisition module;
a first determination module;
a first generation module;
a second determination module;
a second generation module; and
a retrieval module;

wherein the acquisition module is configured to acquire a to-be-solved problem input by a user via user interface (UI);
the first determination module is configured to determine a target analysis tool according to the to-be-solved problem;
the first generation module is configured to generate an initial model corresponding to the to-be-solved problem based on the target analysis tool;
wherein the initial model is configured to characterize a plurality of first elements related to the to-be-solved problem and an interaction relationship between the plurality of first elements and a second element input by the user via UI;
the second determination module is configured to determine a target model corresponding to the initial model according to the interaction relationship and the target analysis tool;
the second generation module is configured to generate a problem characterization result of the target model automatically according to a preset interaction relationship;
the retrieval module is configured to generate retrieval information according to the problem characterization result, perform retrieval in a preset database according to the retrieval information to obtain target data, and recommend the target data to the user via UI as a solution to the to-be-solved problem in response to the use's trigger via UI;
the first generation module is configured to generate the plurality of first elements in the target analysis tool according to the to-be-solved problem, and generate the initial model according to the interaction relationship; wherein the plurality of first elements are configured to characterize a factor affecting the to-be-solved problem;
the second determination module is configured to determine a to-be-clipped element among the plurality of first elements according to the interaction relationship, clip the initial model in the target analysis tool, and delete the to-be-clipped element and an interaction relationship involving the to-be-clipped element from the initial model to obtain the target model; and
the second generation module is configured to extract at least one element and at least one interaction relationship from the target model according to the preset interaction relationship, generate a first problem characterization result according to at least one extracted element and at least one extracted interaction relationship, and generate a second problem characterization result based on the first problem characterization result and a response input by the user via UI in accordance with a preset problem list.

6. An electronic device, comprising: a memory; and a processor;
wherein the memory is configured to store a computer program executable by the processor; and the processor is configured to execute the computer program to implement the method of claim 1.

7. A non-transitory computer-readable storage medium, wherein a computer program is stored on the non-transitory computer-readable storage medium; and the computer program is configured to be executed by a processor to implement the method of claim 1.

* * * * *